United States Patent
Lin et al.

(10) Patent No.: US 10,276,693 B1
(45) Date of Patent: Apr. 30, 2019

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Chun-An Lin, Tainan (TW); Chun-Hsiung Lin, Hsinchu County (TW); Chia-Ta Yu, New Taipei (TW); Sai-Hooi Yeong, Hsinchu County (TW); Ching-Fang Huang, Taipei (TW); Wen-Hsing Hsieh, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/799,385

(22) Filed: Oct. 31, 2017

(51) Int. Cl.
| | |
|---|---|
| *H01L 29/66* | (2006.01) |
| *H01L 29/78* | (2006.01) |
| *H01L 29/10* | (2006.01) |
| *H01L 21/8234* | (2006.01) |
| *H01L 27/088* | (2006.01) |
| *H01L 21/311* | (2006.01) |
| *H01L 21/3065* | (2006.01) |

(52) U.S. Cl.
CPC .. *H01L 29/6681* (2013.01); *H01L 21/823412* (2013.01); *H01L 21/823431* (2013.01); *H01L 27/0886* (2013.01); *H01L 29/1033* (2013.01); *H01L 29/1083* (2013.01); *H01L 29/7851* (2013.01); *H01L 21/3065* (2013.01); *H01L 21/31116* (2013.01)

(58) Field of Classification Search
CPC .................. H01L 29/6681; H01L 27/0886
See application file for complete search history.

(56) References Cited

U.S. PATENT DOCUMENTS

| | | | | |
|---|---|---|---|---|
| 7,728,324 | B2 * | 6/2010 | Tezuka | H01L 21/823807 257/20 |
| 7,910,988 | B2 * | 3/2011 | Taketani | H01L 27/10876 257/330 |
| 8,796,666 | B1 | 8/2014 | Huang et al. | |
| 8,815,712 | B2 | 8/2014 | Wan et al. | |
| 8,963,258 | B2 | 2/2015 | Yu et al. | |
| 9,059,217 | B2 * | 6/2015 | Cheng | H01L 29/6681 |
| 9,093,530 | B2 | 7/2015 | Huang et al. | |
| 9,171,929 | B2 | 10/2015 | Lee et al. | |
| 9,214,555 | B2 | 12/2015 | Oxland et al. | |
| 9,236,267 | B2 | 1/2016 | De et al. | |
| 9,306,066 | B2 * | 4/2016 | Xu | H01L 21/02164 |
| 9,324,827 | B1 * | 4/2016 | Singh | H01L 29/785 |
| 9,502,532 | B2 * | 11/2016 | Park | H01L 29/66636 |

(Continued)

*Primary Examiner* — William Coleman
(74) *Attorney, Agent, or Firm* — Maschoff Brennan

(57) ABSTRACT

A semiconductor device includes a substrate, a bottom semiconductor fin, at least one sidewall structure, a top semiconductor fin, and a gate structure. The bottom semiconductor fin is disposed on the substrate. The sidewall structure protrudes from the semiconductor fin. The top semiconductor fin is disposed on the bottom semiconductor fin. The top semiconductor fin includes a channel portion and at least one source/drain portion. The source/drain portion is disposed between the channel portion and the sidewall structure. The gate structure covers the channel portion of the top semiconductor fin.

20 Claims, 14 Drawing Sheets

(56) References Cited

U.S. PATENT DOCUMENTS

| | | |
|---|---|---|
| 9,520,482 B1 | 12/2016 | Chang et al. |
| 9,548,303 B2 | 1/2017 | Lee et al. |
| 9,576,814 B2 | 2/2017 | Wu et al. |
| 9,691,665 B2 * | 6/2017 | Hsu ................. H01L 21/823475 |
| 9,755,019 B1 * | 9/2017 | Fung ............... H01L 21/823431 |
| 9,905,649 B2 * | 2/2018 | Balakrishnan ...... H01L 29/1054 |
| 9,953,836 B2 * | 4/2018 | Wen ..................... H01L 21/845 |
| 2013/0011986 A1 * | 1/2013 | Zhou ................. H01L 29/4975 |
| | | 438/290 |

* cited by examiner

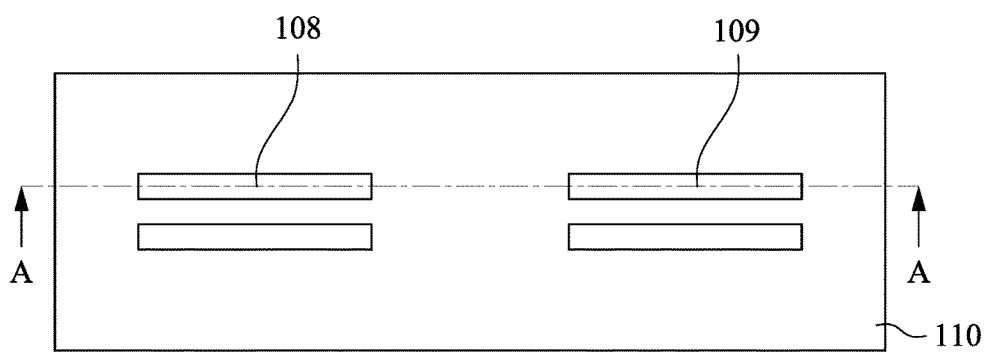
Fig. 3A
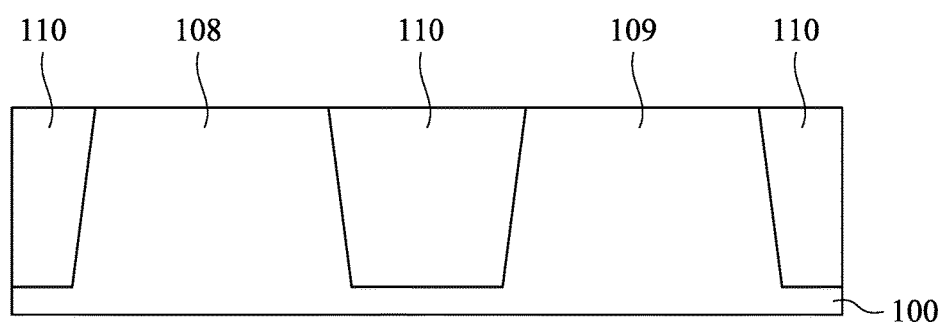
Fig. 3B
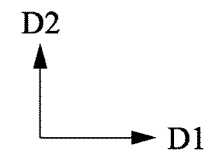

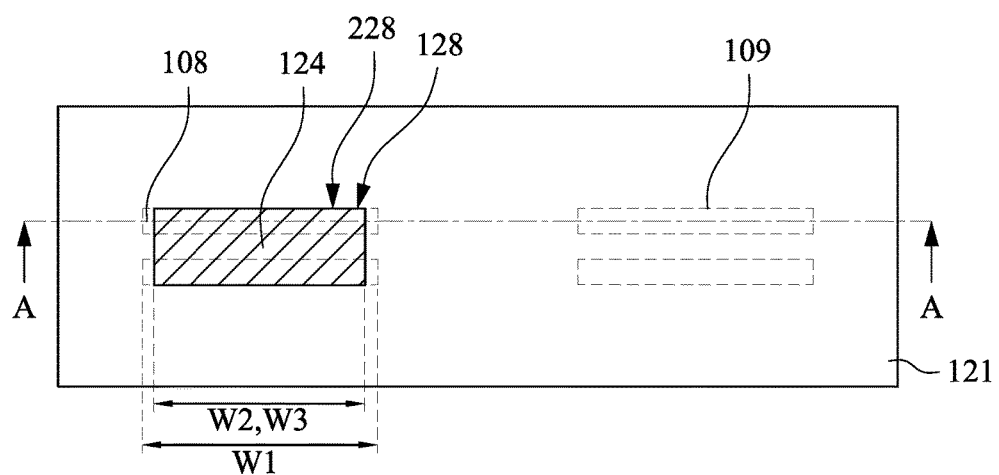
Fig. 5A
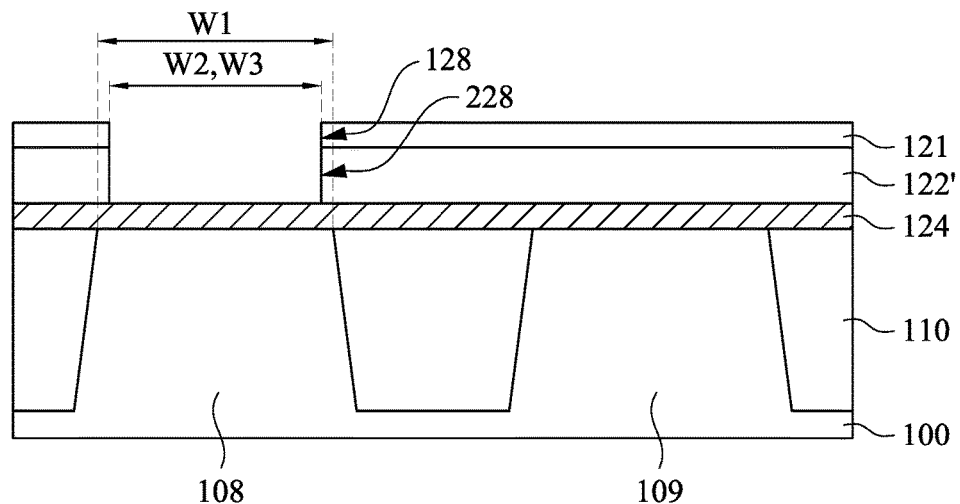
Fig. 5B
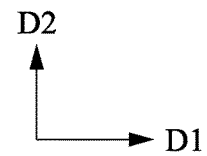

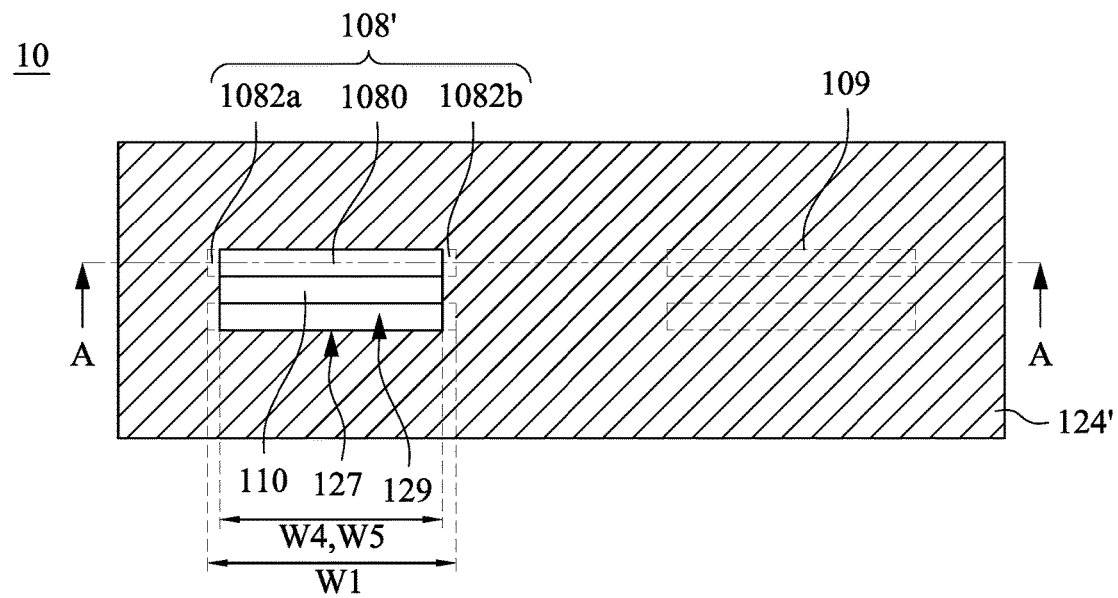
Fig. 6A
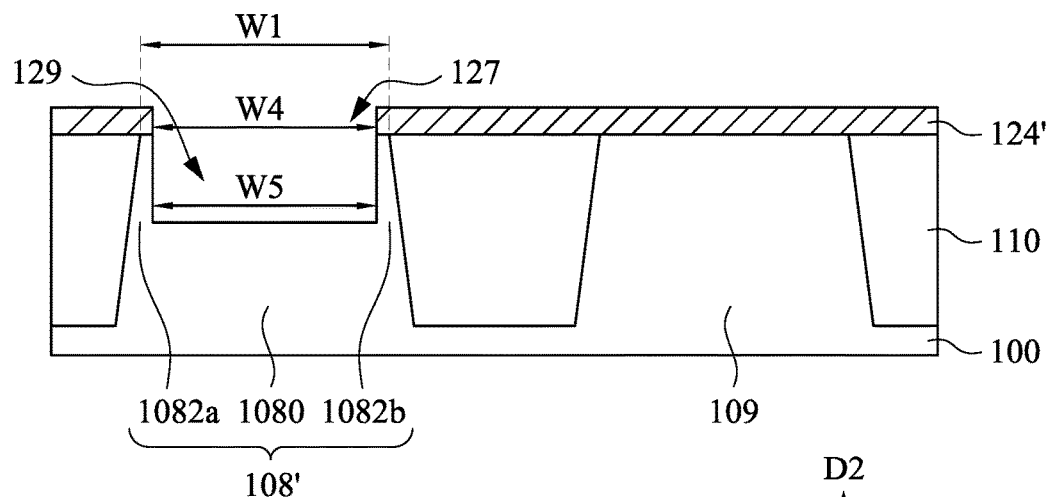
Fig. 6B
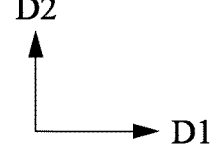

SEMICONDUCTOR DEVICE AND MANUFACTURING METHOD THEREOF

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices include semiconductor fins with high aspect ratios and in which channel and source/drain regions of semiconductor transistor devices are formed. A gate is formed over and along the sides of the fin structure (e.g., wrapping) utilizing the increased surface area of the channel and source/drain regions to produce faster, more reliable and better-controlled semiconductor transistor devices. In some devices, strained materials in source/drain (S/D) portions of the FinFET utilizing, for example, silicon germanium (SiGe), silicon phosphide (SiP) or silicon carbide (SiC), may be used to enhance carrier mobility. Further, channel on oxide structures have been proposed to improve carrier mobility and to maintain a straight fin profile.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-8A are top views of a local semiconductor device at various stages of fabrication in accordance with some embodiments of the present disclosure;

FIGS. 1B-8B are cross-sectional views along sections A-A in FIGS. 1A-8A respectively.

DETAILED DESCRIPTION

Figure 1A:
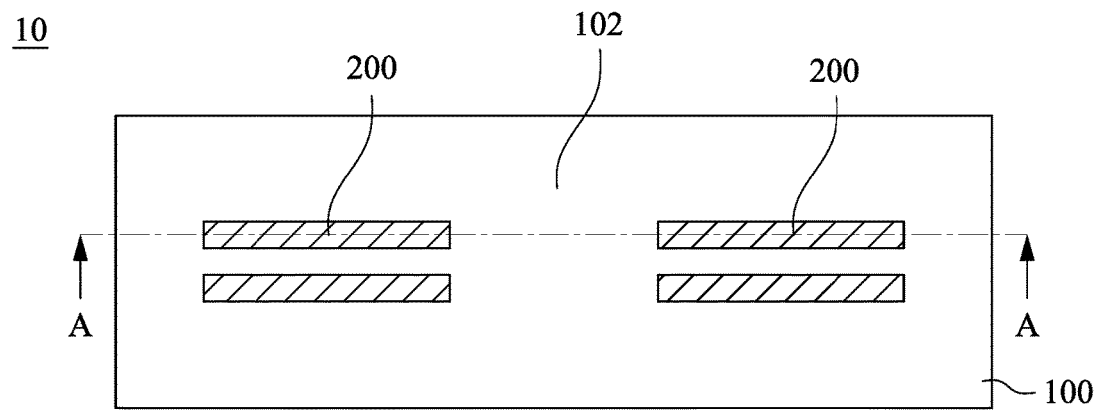

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Illustrative embodiments for forming a semiconductor device will be described below with reference to FIGS. 1A-19. The structures illustrate operations which may be used in the process of forming a semiconductor device. FIGS. 1A-8A are top views of a local semiconductor device 10 at various stages of fabrication in accordance with some embodiments of the present disclosure. FIGS. 1B-8B are cross-sectional views along sections A-A in FIGS. 1A-8A respectively. FIGS. 9-19 are cross-sectional views of a local semiconductor device 10 at various stages of fabrication in accordance with some embodiments of the present disclosure.

Figure 1B:
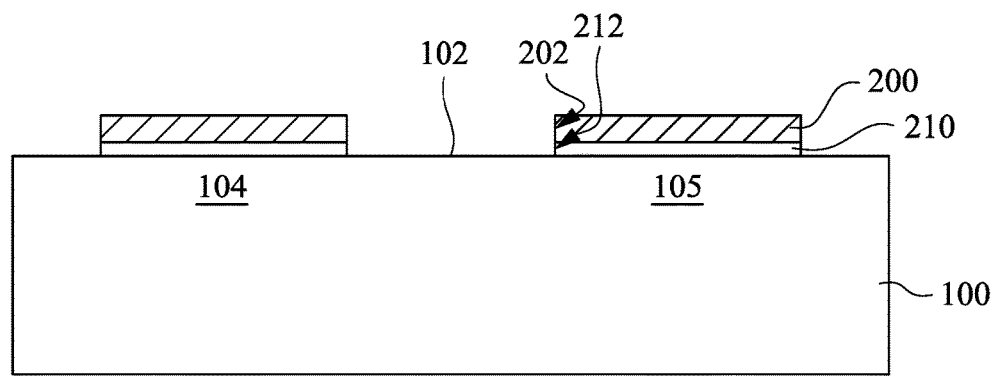
Figure 1B:
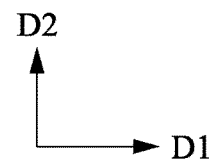

Reference is made to FIGS. 1A and 1B. FIG. 1A is a top view of a local semiconductor device 10. FIG. 1B is cross-sectional views along sections A-A in FIG. 1A. A substrate 100 is provided. The substrate 100 has a top surface 102. A patterned mask layer 200 (may be a hard mask layer) is disposed on the top surface 102 of the substrate 100. In some embodiments, the substrate 100 may include silicon (Si). Alternatively, the substrate 100 may include germanium (Ge), silicon germanium, gallium arsenide (GaAs) or other appropriate semiconductor materials. Also alternatively, the substrate 100 may include an epitaxial layer. For example, the substrate 100 may have an epitaxial layer overlying a bulk semiconductor. Further, the substrate 100 may be strained for performance enhancement. For example, the epitaxial layer may include a semiconductor material different from those of the bulk semiconductor such as a layer of silicon germanium overlying a bulk silicon or a layer of silicon overlying a bulk silicon germanium formed by a process including selective epitaxial growth (SEG). Furthermore, the substrate 100 may include a semiconductor-on-insulator (SOI) structure such as a buried dielectric layer. Also alternatively, the substrate 100 may include a buried dielectric layer such as a buried oxide (BOX) layer, such as that formed by a method referred to as separation by implantation of oxygen (SIMOX) technology, wafer bonding, SEG, or other appropriate method. In various embodiments may include any of a variety of substrate structures and material.

The mask layer 200 maintains the integrity of the patterns during etching of a recess 106 (see FIGS. 2A and 2B) formed in the substrate 100. In some embodiments, the mask layer 200 is used as a planarization stop layer during the removal of excess flowable dielectric layer that fills the recess 106 (discussed in the process of FIGS. 3A and 3B). In some embodiments, the mask layer 200 includes nitride. For example, the mask layer 200 is made of silicon nitride (SiN). However, other materials, such as SiON, silicon carbide, or a combination thereof, may also be used. The mask layer 200 may be formed by a process such as chemical vapor deposition (CVD), plasma enhanced chemical vapor deposition (PECVD), or low pressure chemical vapor deposition (LPCVD). Alternatively, the mask layer 200 may be first made of a silicon oxide and then converted to SiN by nitridation.

In some embodiments, a protective layer 210 is formed over the top surface 102 of the substrate 100 and between the mask layer 200 and the substrate 100. The protective layer 210 protects the top surface 102 from direct contact with the mask layer 200. For example, for a portion of the substrate 100 next to the recess 106 (see FIGS. 2A and 2B) which is filled by the isolation material 110 (see FIGS. 3A and 3B), the protective layer 210 can protect active regions 104 and 105 formed in the portion of the substrate 100. The active regions 104 and 105 are used for forming devices (such as transistors, resistors, etc.) after the isolation material 110 are formed. Depending upon the devices to be formed, the active regions 104 and 105 may include either a p-well or an n-well as determined by the design conditions. In some embodiments, the protective layer 210 is made of a thermal oxide. Once formed, the mask layer 200 and the protective layer 210 are patterned through suitable photolithographic and etching processes to form openings 202 and 212 over the top surface 102 for the recess 106 of FIGS. 2A and 2B.

Figure 2A:
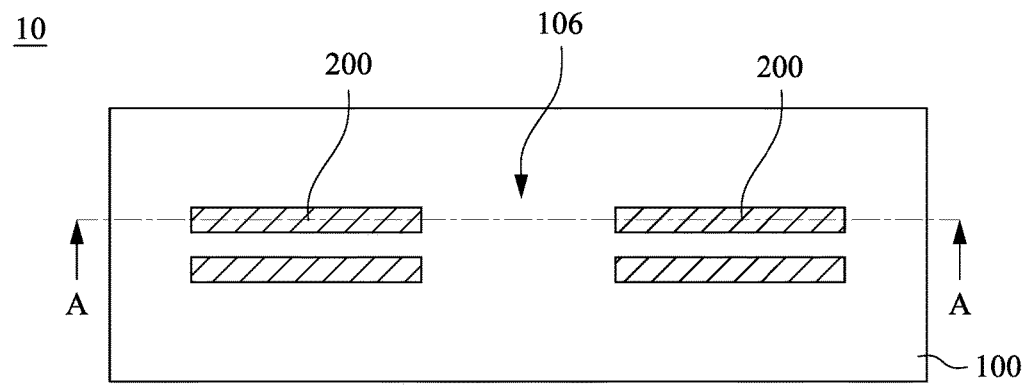
Figure 2B:
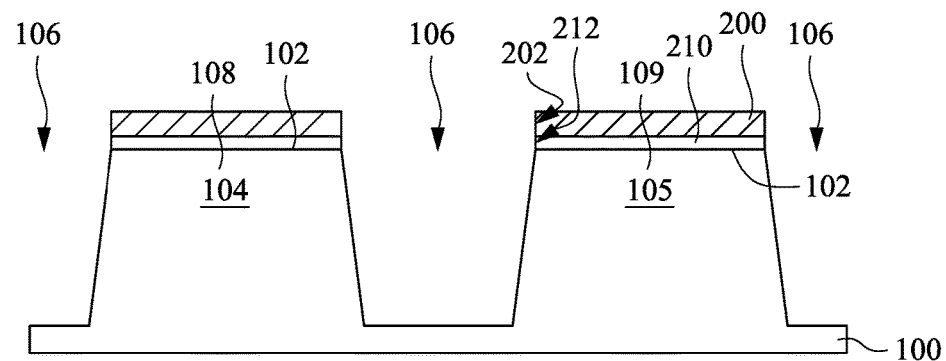

Reference is made to FIGS. 2A and 2B. FIG. 2A is a top view of the local semiconductor device 10. FIG. 2B is cross-sectional views along sections A-A in FIG. 2A. The substrate 100 of FIGS. 1A and 1B are patterned to form semiconductor fins 108 and 109. The semiconductor fins 108 and 109 extend along a direction D1 and protrude from the substrate 100 along a direction D2. The direction D1 intersects with the direction D2. In some embodiments, the direction D1 is orthogonal to the direction D2. The exposed portions of the substrate 100 through the openings 202 and 212 are removed by an etching process, such as reactive ion etching (RIE), in order to form the recess 106 in the substrate 100. The recess 106 faces the top surface 102 of the substrate 100 and separates the active regions 104 and 105 near the top surface 102 of the substrate 100. In some embodiments, the semiconductor device can be a Fin field effect transistor (FinFET), and the recess 106 is configured to separate adjacent two semiconductor fins 108 and 109 formed in the substrate 100.

Reference is made to FIGS. 3A and 3B. FIG. 3A is a top view of the local semiconductor device 10. FIG. 3B is cross-sectional views along sections A-A in FIG. 3A. After the forming of the semiconductor fins 108 and 109, a flowable dielectric material is deposited to form an isolation material 110 at least in the recess 106 around the semiconductor fins 108 and 109. A flowable dielectric material overfills the recess 106 and the mask layer 210 to form a flowable dielectric layer. The flowable dielectric layer can be formed by using a spin on dielectric (SOD) formation process, or by depositing a flowable dielectric by a chemical vapor deposition (CVD) process, such as radical-component CVD. The examples of flowable silicon oxide precursors, include a silicate, a siloxane, a methyl SilsesQuioxane (MSQ), a hydrogen SisesQuioxane (HSQ), an MSQ/HSQ, a perhydrosilazane (TCPS), a perhydro-polysilazane (PSZ), a tetraethyl orthosilicate (TEOS), or a silyl-amine (SA). Then, a planarization process is performed to remove the flowable dielectric layer outside the recess 106 to form the isolation material 110. That is, a top surface of the isolation material 110 and top surfaces of the semiconductor fins 108 and 109 are coplanar. In some embodiments, the planarization process is a chemical-mechanical polishing (CMP) process. In some embodiments, the planarization process removes the flowable dielectric layer outside the recess 106. In some embodiments, the planarization process also removes the mask layer 210 and the protective layer 210 (see FIGS. 2A and 2B). In some other embodiments, the planarization process removes the mask layer 210, however, the protective layer 210 is removed by an etching process.

Figure 4A:
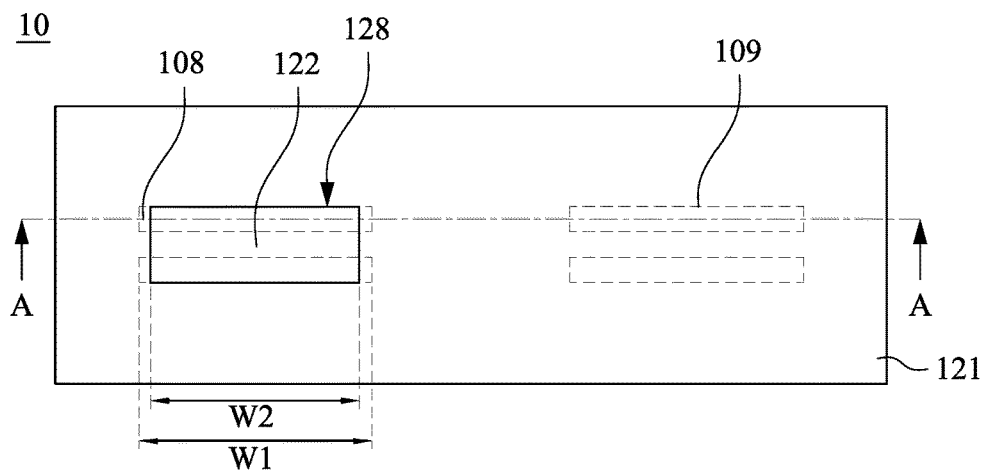
Figure 4B:
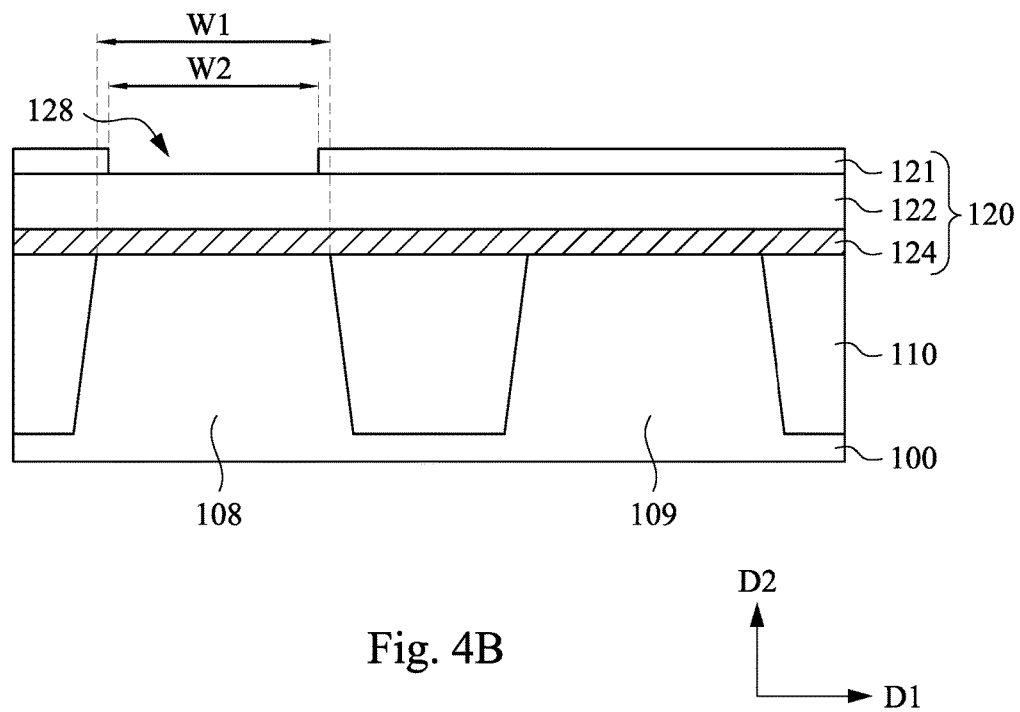

Reference is made to FIGS. 4A and 4B. FIG. 4A is a top view of the local semiconductor device 10. FIG. 4B is cross-sectional views along sections A-A in FIG. 4A. After the forming of the isolation material 110, a tri-layer photoresist 120 is formed on the substrate 100 and the isolation material 110.

In some embodiments, the tri-layer photoresist 120 may be used, including a photoresist (PR) layer 121 as the top or uppermost portion, a middle layer 122, and a bottom layer 124. The tri-layer photoresist 120 is disposed on the substrate 100 and the isolation material 110. The middle layer 122 of the tri-layer photoresist 120 which may include anti-reflective layers or backside anti-reflective layers to aid in the exposure and focus of the PR processing, and the bottom layer 124 which may be a hard mask material; for example, an oxide. To pattern the tri-layer photoresist 120, the PR layer 121 is patterned using a mask, exposure to radiation, such as light or an excimer laser, for example, a bake or cure operation to harden the resist, and use of a developer to remove either the exposed or unexposed portions of the resist, depending on whether a positive resist or a negative resist is used, to form the pattern from the mask in the PR layer 121. The PR layer 121 is patterned to form an opening 128 above the semiconductor fin 108. Specifically, the vertically projection of the opening 128 is locates on the semiconductor fin 108 and outside the semiconductor fin 109. The opening 128 has a width W2 along the direction D1. The semiconductor fin 108 has a width W1 along the direction D1, and the width W1 is larger than the width W2. This patterned PR layer 121 is then used to etch the underlying middle layer 122 and bottom layer 124 to form an etch mask for the target layer; here, the semiconductor fin 108 from the opening 128.

Reference is made to FIGS. 5A and 5B. FIG. 5A is a top view of the local semiconductor device 10. FIG. 5B is cross-sectional views along sections A-A in FIG. 5A. After the forming of the tri-layer photoresist 120, the middle layer 122 of FIGS. 4A and 4B are patterned to form an opening 228. A trench etching is performed to form a patterned middle layer 122' having the opening 228 therein. The opening 228 has a width W3 along the direction D1 substantially equal to the width W2 of opening 128 and smaller than the width W1 of the semiconductor fin 108. In FIGS. 5A and 5B, the patterned PR layer 121 is used as a mask during the trench etching. The term "substantially" as used herein may be applied to modify any quantitative representation which could permissibly vary without resulting in a change in the basic function to which it is related. In the trench etching, the middle layer 122 (see FIGS. 4A and 4B) may be etched by various methods, including a dry etch, a wet etch, or a combination of dry etch and wet etch. The dry etching process may implement fluorine-containing gas (e.g., $CF_4$, $SF_6$, $CH_2F_2$, $CHF_3$, and/or $C_2F_6$), chlorine-containing gas (e.g., $C_{12}$, $CHC_{13}$, $CC_{14}$, and/or $BC_{13}$), bromine-containing gas (e.g., HBr and/or $CHBR_3$), oxygen-containing gas, iodine-containing gas, other suitable gases and/or plasmas, or combinations thereof. The etching process may include a multiple-step etching to gain etch selectivity, flexibility and desired etch profile.

Reference is made to FIGS. 6A and 6B. FIG. 6A is a top view of the local semiconductor device 10. FIG. 6B is cross-sectional views along sections A-A in FIG. 6A. After the patterned of the middle layer 122 (see FIG. 5B), the bottom layer 124 of FIG. 5B is patterned to form an opening 127. After the mask layer 124 is patterned, the patterned PR layer 121 and the patterned middle layer 122' are removed, and then the semiconductor fin 108 is etched to form a trench 129 through the opening 127. That is, using the patterned bottom layer 124' as a mask, the semiconductor fin 108 is etched to form an etched semiconductor fin 108' having the trench 129 therein.

In other words, the etched semiconductor fin 108' is formed by removing the portion thereof, thereby forming a bottom semiconductor fin 1080, and forming a first sidewall structure 1082a and a second sidewall structure 1082b disposed over the bottom semiconductor fin 1080. Specifically, the bottom semiconductor fin 1080 is disposed on the substrate 100, and extends along the direction D1 as the semiconductor fin 108. The first sidewall structure 1082a and the second sidewall structure 1082b protrude from the bottom semiconductor fin 1080 facing away the substrate 100, and define the trench 129 with the bottom semiconductor fin 1080 therebetween. That is, the trench 129 is formed by inner surfaces of the first sidewall structure 1082a and the second sidewall structure 1082b and a top surface the bottom semiconductor fin 1080. In addition, the first sidewall structure 1082a and a second sidewall structure 1082b are covered by the patterned bottom layer 124'. The opening 127 of the patterned bottom layer 124' and the trench 129 of the semiconductor fin 108 have a width W4 and a width W5 along the direction D1 respectively. The width W4 and the width W5 is substantially the same and both smaller than the width W1 of the semiconductor fin 108.

In some embodiments, the trench 129 is formed by various methods, including a dry etch, a wet etch, or a combination of dry etch and wet etch. The dry etching process may implement fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), oxygen-containing gas, iodine-containing gas, other suitable gases and/or plasmas, or combinations thereof. The etching process may include a multiple-step etching to gain etch selectivity, flexibility and desired etch profile.

Figure 7A:
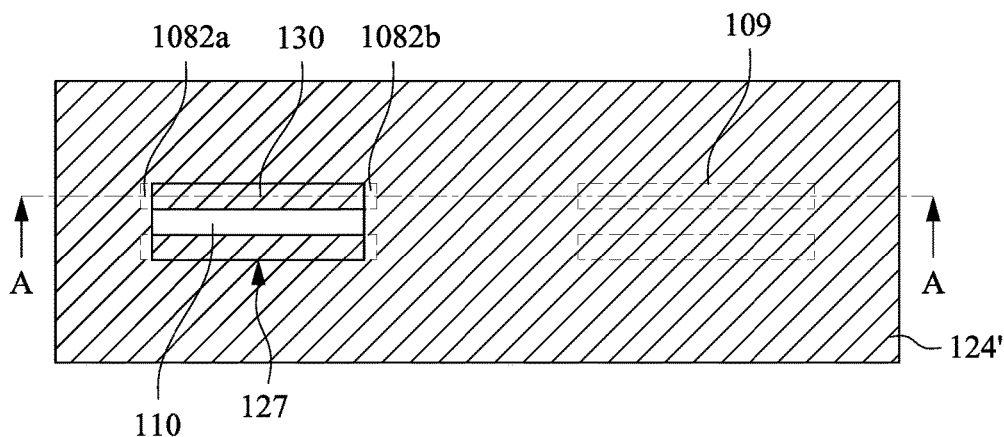
Figure 7B:
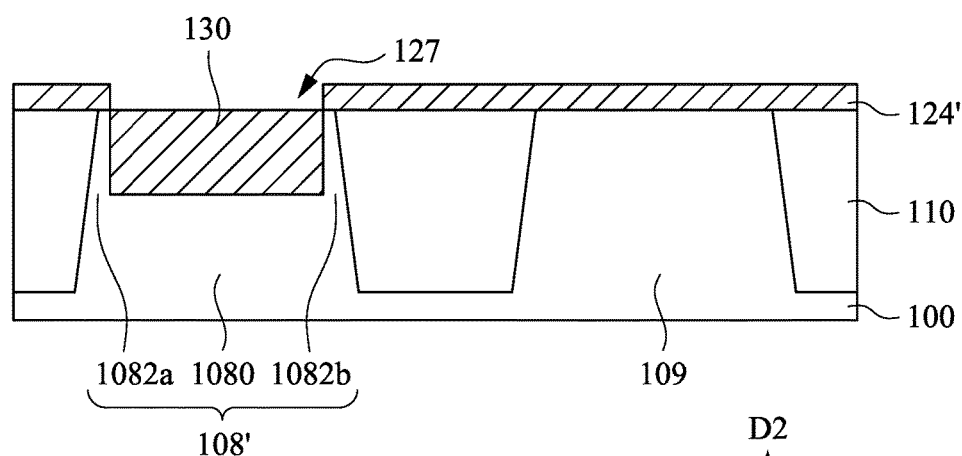

Reference is made to FIGS. 7A and 7B. FIG. 7A is a top view of the local semiconductor device 10. FIG. 7B is cross-sectional views along sections A-A in FIG. 7A. After the etched of the semiconductor fin 108 to form the trench 129, a top semiconductor fin 130 as the active region 104 (see FIGS. 1B and 2B) is formed in the trench 129. An epitaxial growth process is performed on exposed parts of the first sidewall structure 1082a and the second sidewall structure 1082b, and performed on exposed parts of the bottom semiconductor fin 1080 from the opening 127. Then, an epitaxy material is formed in the trench 129.

Specifically, the epitaxy material epitaxial grows at least from the first sidewall structure 1082a, the second sidewall structure 1082b, and the bottom semiconductor fin 1080. Then, a portion of the epitaxy material above a top surface of the isolation material 110 is removed to form the top semiconductor fin 130 in the trench 129 and over the bottom semiconductor fin 1080. Therefore, the top semiconductor fin 130 is formed between the first sidewall structure 1082a and the second sidewall structure 1082b and on the bottom semiconductor fin 1080. As such, opposite sidewalls of the top semiconductor fin 130 are in contact with the first sidewall structure 1082a and the second sidewall structure 1082b, and a bottom portion of the top semiconductor fin 130 is in contact with the bottom semiconductor fin 1080. On the other hand, the first sidewall structure 1082a and the second sidewall structure 1082b are located on two opposite ends of the top semiconductor fin 130, respectively disposed between and extends pass the top semiconductor fin 130 and the isolation material 110, and arranged in the direction D1.

In some embodiments, at least one of the first sidewall structure 1082a and the second sidewall structure 1082b is made of a material that is the same as the bottom semiconductor fin 1080, and the top semiconductor fin 130 is made of a material that is different from that of the bottom semiconductor fin 1080. In some embodiments, the top semiconductor fin 130 is made of the material whose lattice constant is greater than that of the at least one the first sidewall structure 1082a, the second sidewall structure 1082b, and the bottom semiconductor fin 1080. In some embodiments, the bottom semiconductor fin 1080, the first sidewall structure 1082a, and the second sidewall structure 1082b may include a material such as Si, and the top semiconductor fin 130 may include a material such as SiGe.

With such configuration, the first sidewall structure 1082a, the second sidewall structure 1082b, and the bottom semiconductor fin 1080 are positioned such that subsequent epitaxial growth processes that forming the top semiconductor fin 130 during device fabrication do not in contact with the isolation material 110 on ends of the bottom semiconductor fin 1080. Here, if the top semiconductor fin 130 is not formed on the first sidewall structure 1082a and the second sidewall structure 1082b, defects such as voids or dislocations may be formed at an interface of the isolation material 110 and the top semiconductor fin 130, because the isolation material 110 is less easily grown on the oxide surface. In contrast, since the top semiconductor fin 130 is in contact with the first sidewall structure 1082a and the second sidewall structure 1082b, the epitaxial growth of the top semiconductor fin 130 is enhanced.

Figure 8A:
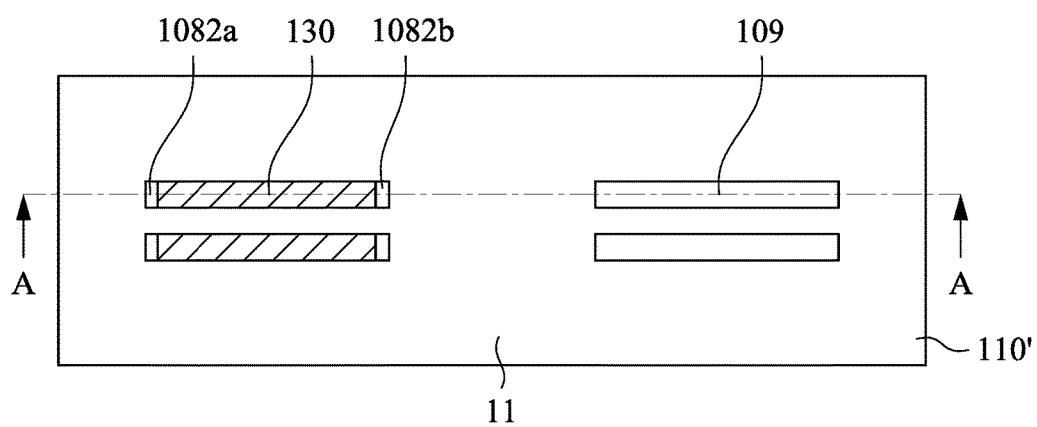
Figure 8B:
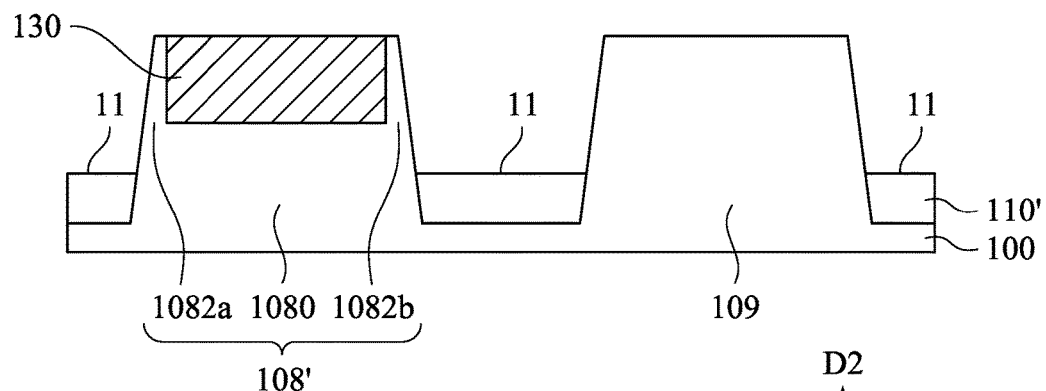

Reference is made to FIGS. 8A and 8B. FIG. 8A is a top view of the local semiconductor device 10. FIG. 8B is cross-sectional views along sections A-A in FIG. 8A. After the forming of the top semiconductor fin 130, the patterned bottom layer 124' is removed and the isolation material 110 is recessed to form an isolation structure 110'. An anisotropic etch is used to recess the isolation material 110 into the substrate 100 to form the isolation structure 110'. The isolation structure 110' surrounds the etched semiconductor fin 108' and the semiconductor fin 109. The etched semiconductor fin 108' and the semiconductor fin 109 are exposed above the isolation structure 110'. That is, a top portion of the etched semiconductor fin 108' and the semiconductor fin 109 are not covered by the isolation structure 110', and a bottom surface of the top semiconductor fin 130 is higher than a top surface 11 of the isolation structure 110'.

Specifically, as shown in FIGS. 8A and 8B, the isolation structure 110' is disposed on the substrate 100, and from the top surface of the isolation structure 110', a total of the first sidewall structure 1082a, the second sidewall structure 1082b, and the top semiconductor fin 130 are exposed. The first sidewall structure 1082a and the second sidewall structure 1082b cap the top semiconductor fin 130. The first sidewall structure 1082a and the second sidewall structure 1082b are respectively located between the isolation structure 110' and the top semiconductor fin 130. Furthermore, a bottom portion of at least one of the first sidewall structure 1082a, the second sidewall structure 1082b, and the top semiconductor fin 130 is higher than a top surface 11 of the isolation structure 110'.

Figure 9:
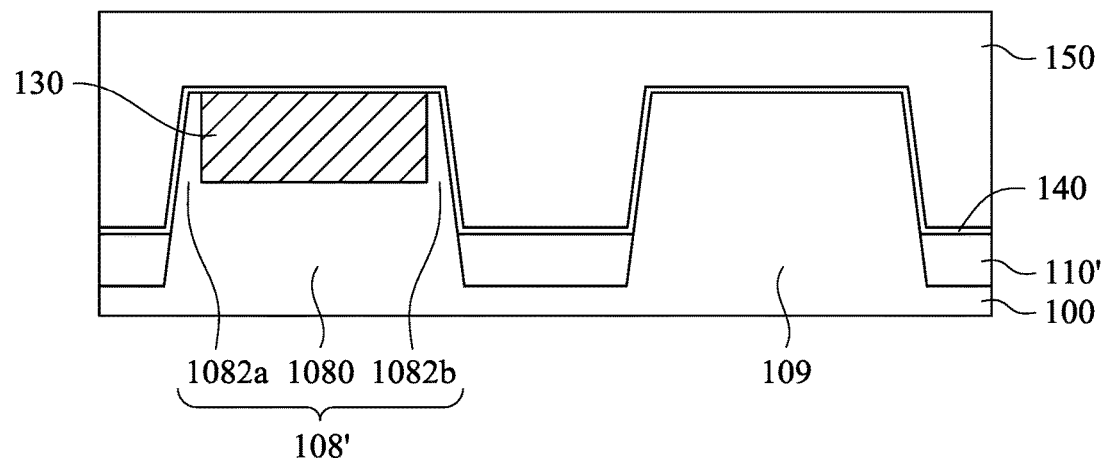
FIGS. 9-19 are cross-sectional views of a local semiconductor device at various stages of fabrication in accordance with some embodiments of the present disclosure.

Reference is made to FIG. 9. FIG. 9 is a cross-sectional view of the local semiconductor device 10. After the removing the patterned bottom layer 124' and the recessed of the isolation structure 110, an interlayer dielectric 140 and a dummy layer 150 are disposed on the isolation structure 110', the etched semiconductor fin 108', and the semiconductor fin 109.

The interlayer dielectric 140 is formed to cover the isolation structure 110', the etched semiconductor fin 108', and the semiconductor fin 109. The interlayer dielectric 140 may be formed by thermal oxidation, chemical vapor deposition, sputtering, or other methods known and used in the art for forming a gate dielectric. The interlayer dielectric 140 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. Some embodiments may include hafnium oxide ($HfO_2$), hafnium silicon oxide (HfSiO), hafnium silicon oxynitride (HfSiON), hafnium tantalum oxide (HfTaO), hafnium titanium oxide (HMO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. The interlayer dielectric 140 may have a multilayer structure such as one layer of silicon oxide (e.g., interfacial layer) and another layer of high-k material. The interlayer dielectric 140 may be formed using chemical vapor deposition (CVD), physical vapor deposition (PVD), atomic layer deposition (ALD), thermal oxide, ozone oxidation, other suitable processes, or combinations thereof.

The dummy layer 150 is formed on the interlayer dielectric 140. The dummy layer 150 may be deposited by chemical vapor deposition (CVD), by sputter deposition, or by other techniques known and used in the art for depositing conductive materials. The dummy layer 150 may include polycrystalline-silicon (poly-Si) or poly-crystalline silicon-germanium (poly-SiGe). Further, the dummy layer 150 may be doped poly-silicon with uniform or non-uniform doping.

Figure 10:
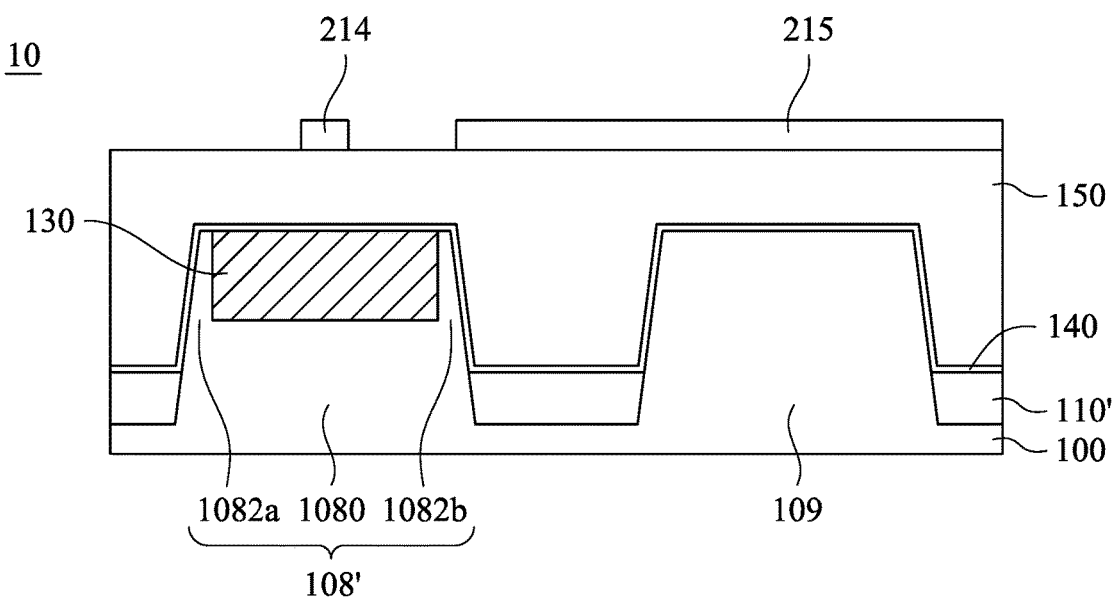

Reference is made to FIG. 10. FIG. 10 is a cross-sectional view of the local semiconductor device 10. After the forming the interlayer dielectric 140 and the dummy layer 150, a patterned mask layer is formed on the dummy layer 150. The patterned mask layer includes masks 214 and 215. The mask 214 defines a profile of a gate electrode disposed on the top semiconductor fin 130, and the mask 215 covers the dummy layer 150 disposed on the semiconductor fin 109.

Figure 11:
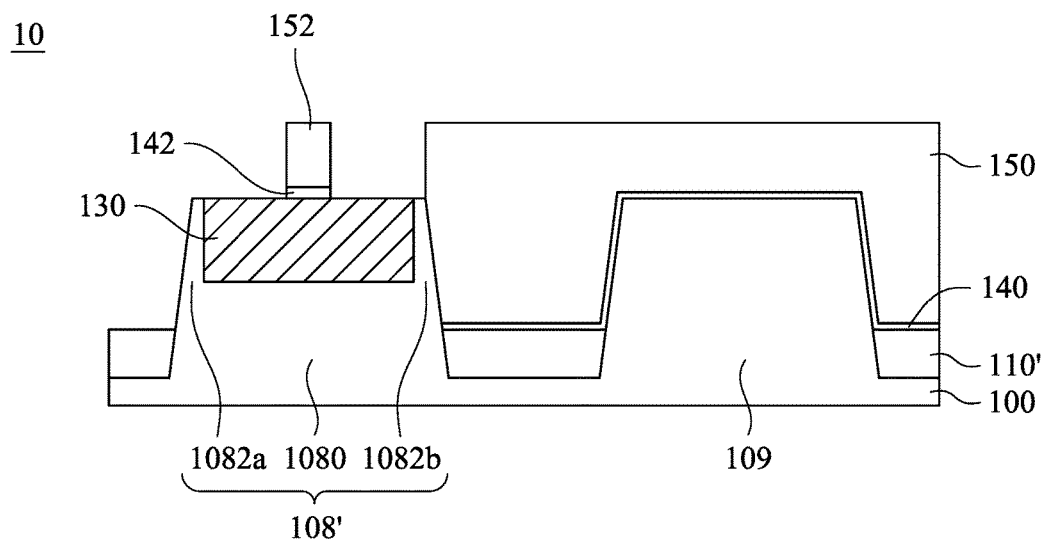

Reference is made to FIG. 11. FIG. 11 is a cross-sectional view of the local semiconductor device 10. After the forming of the masks 214 and 215, the dummy layer 150 of FIG. 10 disposed on the top semiconductor fin 130 is then patterned to form a dummy gate electrode 152 by using the mask 214 (see FIG. 10). The dummy gate electrode 152 is disposed between the first sidewall structure 1082a and the second sidewall structure 1082b, is disposed on and straddles across the top semiconductor fin 130. The dummy layer 150 may be patterned by an etching process, such as a dry plasma etching process or a wet etching process. At least one parameter, such as etchant, etching temperature, etching solution concentration, etching pressure, source power, radio frequency (RF) bias voltage, etchant flow rate, of the patterning (or etching) recipe can be tuned.

After the patterning process, the masks 214 and 215 of FIG. 10 may then be removed. The portion of the interlayer dielectric 140 disposed on the top semiconductor fin 130 and not covered by the dummy gate electrode 152 may or may not be removed during the etching process. In the case where some interlayer dielectric 140 remains on the top semiconductor fin 130 not covered by the dummy gate electrode 152, the interlayer dielectric 140 may be subsequently removed by dry or wet etching to form a gate dielectric 142. The gate dielectric 142 and the dummy gate electrode 152 can refer to as a gate structure 302. Thus, the gate structure 302 is disposed between the first sidewall structure 1082a and the second sidewall structure 1082b, and is disposed on and straddles across the top semiconductor fin 130.

Figure 12:
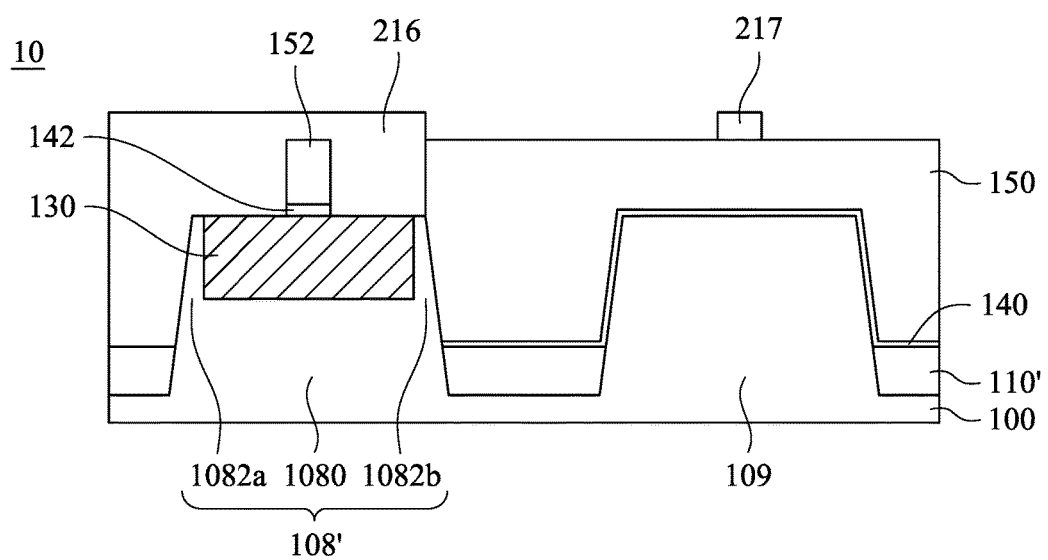

Reference is made to FIG. 12. FIG. 12 is a cross-sectional view of the local semiconductor device 10. After the forming the dummy gate electrode 152 and the gate dielectric 142, another patterned mask layer is formed on the remaining dummy layer 150 and the dummy gate electrode 152. The patterned mask layer includes masks 216 and 217. The mask 217 defines a profile of a dummy gate electrode 154 (see FIG. 13) disposed on the semiconductor fin 109, and the mask 216 covers the dummy gate electrode 152, the top semiconductor fin 130, the etched semiconductor fin 108', and the isolation structure 110'.

Figure 13:
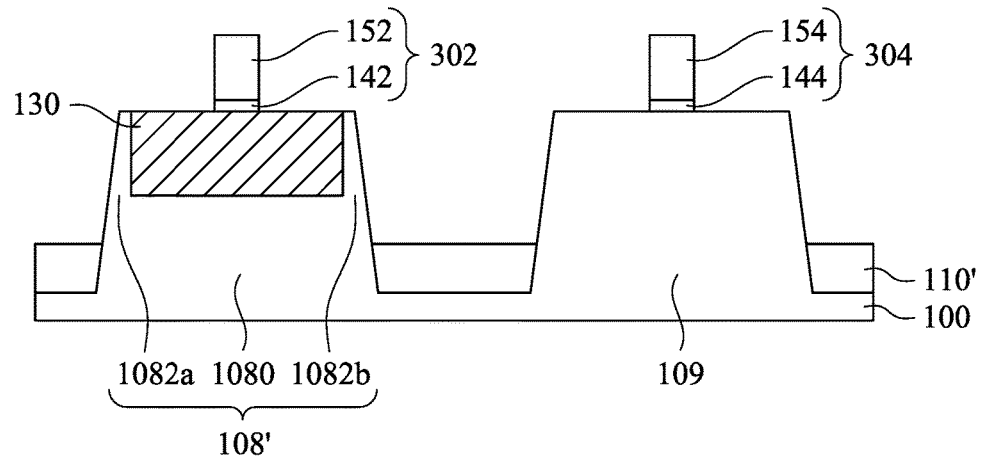

Reference is made to FIG. 13. FIG. 13 is a cross-sectional view of the local semiconductor device 10. After the forming the other patterned mask layer, the remaining dummy layer 150 of FIG. 12 disposed on the semiconductor fin 109 is then patterned to form a dummy gate electrode 154 by using the mask 217 (see FIG. 12). The remaining dummy layer 150 may be patterned by an etching process, such as a dry plasma etching process or a wet etching process. At least one parameter, such as etchant, etching temperature, etching solution concentration, etching pressure, source power, radio frequency (RF) bias voltage, etchant flow rate, of the patterning (or etching) recipe can be tuned.

After the patterning process, the masks 216 and 217 of FIG. 12 may then be removed. The portion of the interlayer dielectric 140 not covered by the dummy gate electrode 154 may or may not be removed during the etching process. In the case where some interlayer dielectric 140 remains on the semiconductor fin 109 not covered by the dummy gate electrode 154, the interlayer dielectric 140 may be subsequently removed by dry or wet etching to form a gate dielectric 144. The gate dielectric 144 and the dummy gate electrode 154 can refer to as a gate structure 304.

It is noted that although in FIGS. 10 to 13, the gate structures 302 and 304 are formed in separated processes, the gate structures 302 and 304 can be formed in the same process in some other embodiments. For example, in FIG. 10, two patterned mask layers can be formed over the dummy layer 150 and respectively over the top semiconductor fin 130 and the semiconductor fin 109. The dummy layer 150 is then patterned using the patterned mask layers as masks and form the gate structures 302 and 304 respectively over and straddle across the top semiconductor fin 130 and the semiconductor fin 109.

Figure 14:
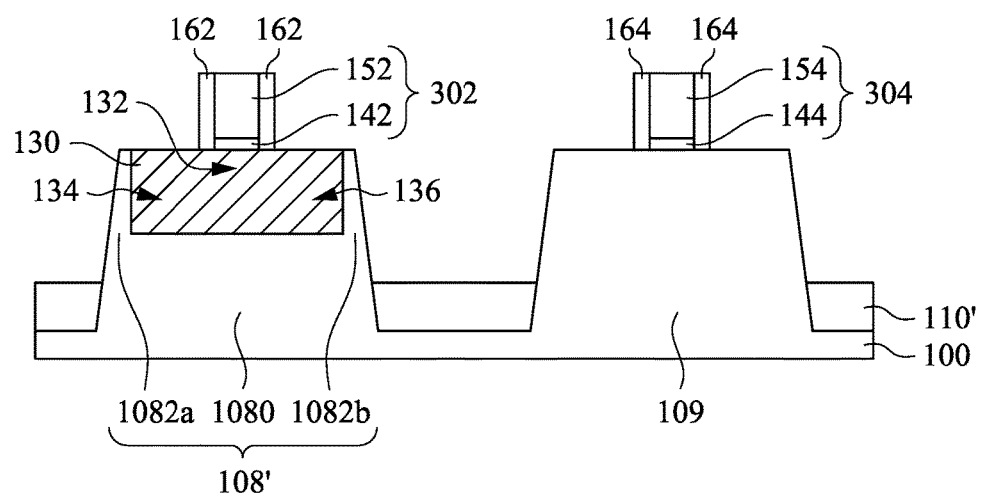

Reference is made to FIG. 14. FIG. 14 is a cross-sectional view of the local semiconductor device 10. After the forming of the gate structures 302 and 304, a pair of gate spacers 162 is formed on the top semiconductor fin 130 and along the dummy gate electrode 152, and a pair of gate spacers 164 is formed on the semiconductor fin 109 and along the dummy gate electrode 164. In some embodiments, the gate spacers 162 and 164 may include silicon oxide, silicon nitride, silicon oxy-nitride, or other suitable material. The gate spacers 162 and 164 may include a single layer or multilayer structure. To form the gate spacers 162 and 164, a blanket layer may be formed on the top semiconductor fin 130 and the semiconductor fin 109 by CVD, PVD, ALD, or other suitable technique. Then, an anisotropic etching is performed on the blanket layer to form the gate spacers 162 and 164 respectively on two sides of the dummy gate electrodes 152 and 154.

Furthermore, the top semiconductor fin 130 includes a channel portion (may also refer to as a channel region) 132 and source/drain portions (may also refer to as source/drain regions) 134 and 136 disposed therein. The channel portion 132 is disposed in the top semiconductor fin 130, below the gate structure 302 and the pair of gate spacers 162, and between the first sidewall structure 1082a and the second sidewall structure 1082b. On the other hand, the gate structure 302 covers the channel portion 132 of the top semiconductor fin. In addition, the source/drain portions 134 and 136 are disposed on opposite sides of the dummy gate electrode 152 and uncovered by the gate structure 302. The source/drain portions 134 is disposed between the channel portion 132 and the first sidewall structure 1082a, and the source/drain portions 136 is disposed between the channel portion 132 and the second sidewall structure 1082b.

With such configuration, the top semiconductor fin 130 is in contact with the first sidewall structure 1082a, the second sidewall structure 1082b, and the bottom semiconductor fin 1080, whereby enabling the channel portion 132 of the top semiconductor fin 130 to improve fully strain channel (FSC) due to the two opposite ends of the top semiconductor fin 130 strain with the first sidewall structure 1082a and the second sidewall structure 1082b of the etched semiconductor fin 108' respectively, thus to improve performance of said two opposite ends. As such, a stress relaxation occurring at the two opposite ends of the top semiconductor fin 130 reduces epitaxial defects, such as, voids or dislocations, at an interface of the sidewall structure 1082a (1082b) and the top semiconductor fin 130. Further, the epitaxial defects of the two opposite ends of the top semiconductor fin 130 will be reduced. Hence, the epitaxial quality of the channel portion 132 of top semiconductor fin 130 will also be enhanced, such that the performance of the channel portion 132 will be improved.

Figure 15:
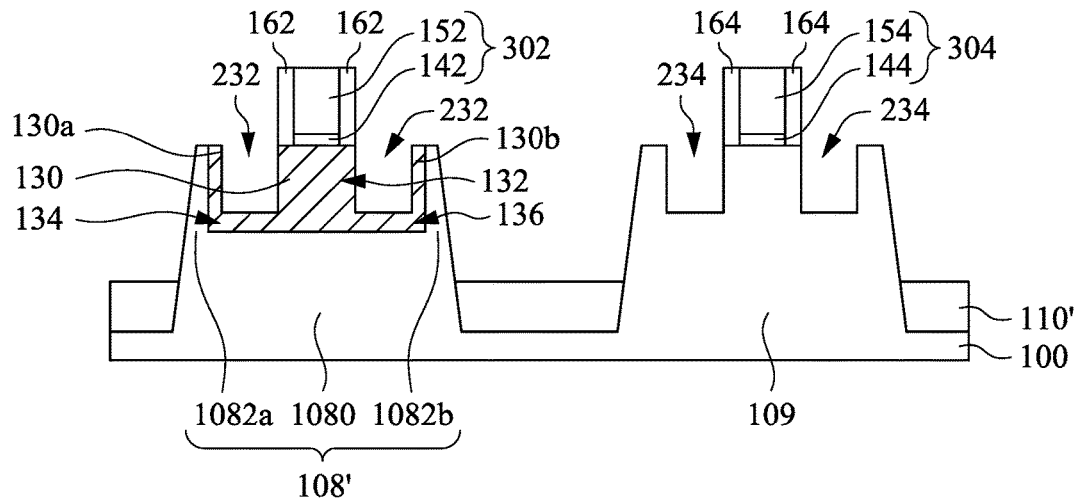

Reference is made to FIG. 15. FIG. 15 is a cross-sectional view of the local semiconductor device 10. After the forming the pairs of the gate spacers 162 and 164, portions of the top semiconductor fin 130 and the semiconductor fin 109 exposed both by the dummy gate electrodes 152 and 154 and the gate spacers 162 and 164 are removed (or recessed) to form recesses 232 and 234 therein. Any suitable amount of material may be removed. Furthermore, after the removing of portions of the top semiconductor fin 130, the top semiconductor fin 130 forms protruding portions 130a and 130b located on two opposite ends thereof, respectively adjacent to and in contact with the first sidewall structure 1082a and the second sidewall structure 1082b, and arranged in the direction D1.

Removing portions of the top semiconductor fin 130 and the semiconductor fin 109 may include forming a photoresist layer or a capping layer (such as an oxide capping layer) over the structure of FIG. 14, patterning the photoresist or capping layer to have openings that expose a portion of the top semiconductor fin 130 and the semiconductor fin 109, and etching back material from the top semiconductor fin 130 and the semiconductor fin 109. In some embodiments, the top semiconductor fin 130 and the semiconductor fin 109 can be etched using a dry etching process. Alternatively, the etching process is a wet etching process, or combination dry and wet etching process. Removal may include a lithography process to facilitate the etching process. The lithography process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography process is implemented or replaced by other methods, such as maskless photolithography, electron-beam writing, and ion-beam writing. In yet some other embodiments, the lithography process could implement nanoimprint technology. In some embodiments, a pre-cleaning process may be performed to clean the recesses 232 and 234 with HF or other suitable solution.

Figure 16:
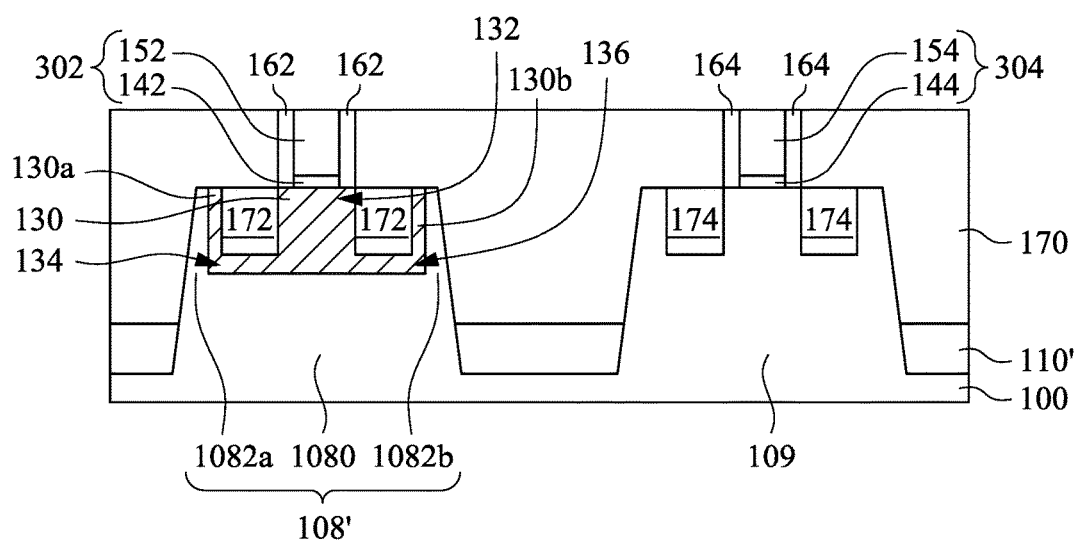

Reference is made to FIG. 16. FIG. 16 is a cross-sectional view of the local semiconductor device 10. After the forming the recesses 232 and 234, a plurality of epitaxy structures 172 and 174 are respectively formed in the recesses 232 and 234 of the top semiconductor fin 130 and the semiconductor fin 109. The epitaxy structures 172 are at least partially embedded in the source/drain portions 134 and 136 of the top semiconductor fin 130, and disposed between the first sidewall structure 1082a and the gate structure 302 and between the second sidewall structure 1082b and the gate structure 302 respectively.

On the other hand, the first sidewall structure 1082a and the second sidewall structure 1082b are separated from the epitaxy structures 172. In other words, protruding portion 130a of the top semiconductor fin 130 is disposed between and in contact with the first sidewall structure 1082a and the epitaxy structures 172, and protruding portion 130b is disposed between and in contact with the second sidewall structure 1082b and the epitaxy structures 172. In some embodiments, a bottom portion of the first sidewall structure 1082a and the second sidewall structure 1082b is lower than a bottom surface of the epitaxy structures 172. In some other embodiments, however, a bottom surface of the epitaxy structures 172 and a bottom surface of the top semiconductor fin 130 are coplanar.

The epitaxy structures 172 and 174 may be formed using one or more epitaxy or epitaxial (epi) processes, such that Si features, SiGe features, and/or other suitable features can be formed in a crystalline state on the recesses 232 and 234 of the top semiconductor fin 130 and the semiconductor fin 109. In some embodiments, the lattice constant of the epitaxy structures 172 and 174 are different from the lattice constant of the top semiconductor fin 130 and the semiconductor fin 109, and the epitaxy structures 172 and 174 are strained or stressed to enable carrier mobility of the semiconductor device and enhance the device performance. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the recesses 232 and 234 of the top semiconductor fin 130 and the semiconductor fin 109 (e.g., silicon). Thus, a strained channel can be achieved to increase carrier mobility and enhance device performance. The epitaxy structures 172 and 174 may be in-situ doped. The doping species include p-type dopants, such as boron or $BF_2$; n-type dopants, such as phosphorus or arsenic; and/or other suitable dopants including combinations thereof. If the epitaxy structures 172 and 174 are not in-situ doped, a second implantation process (i.e., a junction implant process) is performed to dope the epitaxy structures 172 and 174. One or more annealing processes may be performed to activate the epitaxy structures 172 and 174. The annealing processes include rapid thermal annealing (RTA) and/or laser annealing processes.

Then, an interlayer dielectric (ILD) 170 is formed at outer sides of the gate spacers 162 and 164 and on the top semiconductor fin 130 and the semiconductor fin 109. The ILD 170 includes silicon oxide, oxynitride or other suitable materials. The ILD 170 includes a single layer or multiple layers. The ILD 170 is formed by a suitable technique, such as CVD or ALD. A chemical mechanical planarization (CMP) process may be applied to remove excessive ILD 170 and expose the top surface of the dummy gate electrodes 152 and 154 to a subsequent dummy gate removing process.

Figure 17:
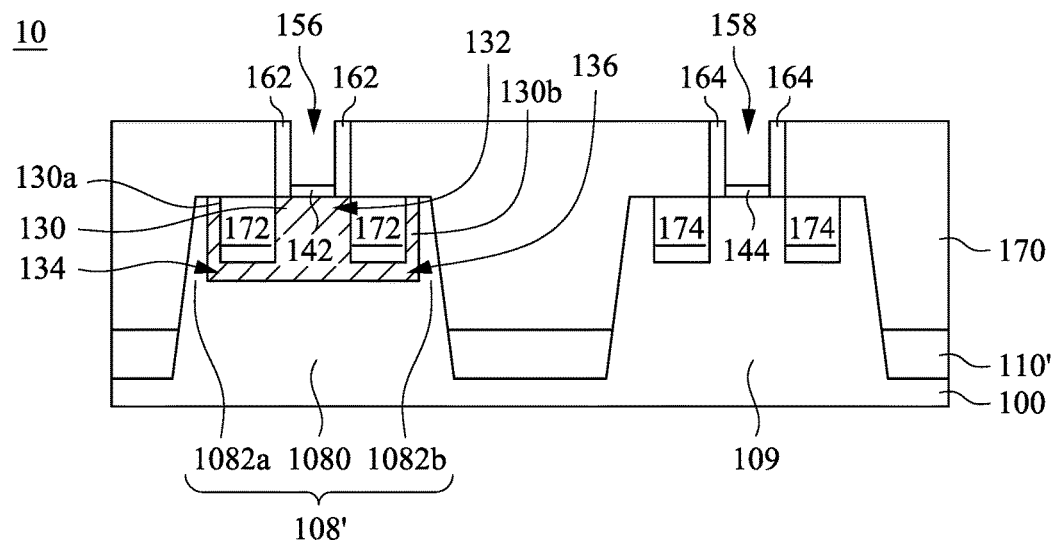

Reference is made to FIG. 17. FIG. 17 is a cross-sectional view of the local semiconductor device 10. After the forming the epitaxy structures 172 and 174 and the ILD 170, the dummy gate electrodes 152 and 154 (see FIG. 16) are removed to form an opening 156 with the gate spacers 162 as its sidewall and an opening 158 with the gate spacers 164 as its sidewall. In some other embodiments, the gate dielectrics 142 and 144 are removed as well. Alternatively, in some embodiments, the dummy gate electrodes 152 and 154 are removed while the gate dielectrics 142 and 144 retains. The dummy gate electrodes 152 and 154 (and the gate dielectrics 142 and 144) may be removed by dry etch, wet etch, or a combination of dry and wet etch. For example, a wet etch process may include exposure to a hydroxide containing solution (e.g., ammonium hydroxide), deionized water, and/or other suitable etchant solutions.

Figure 18:
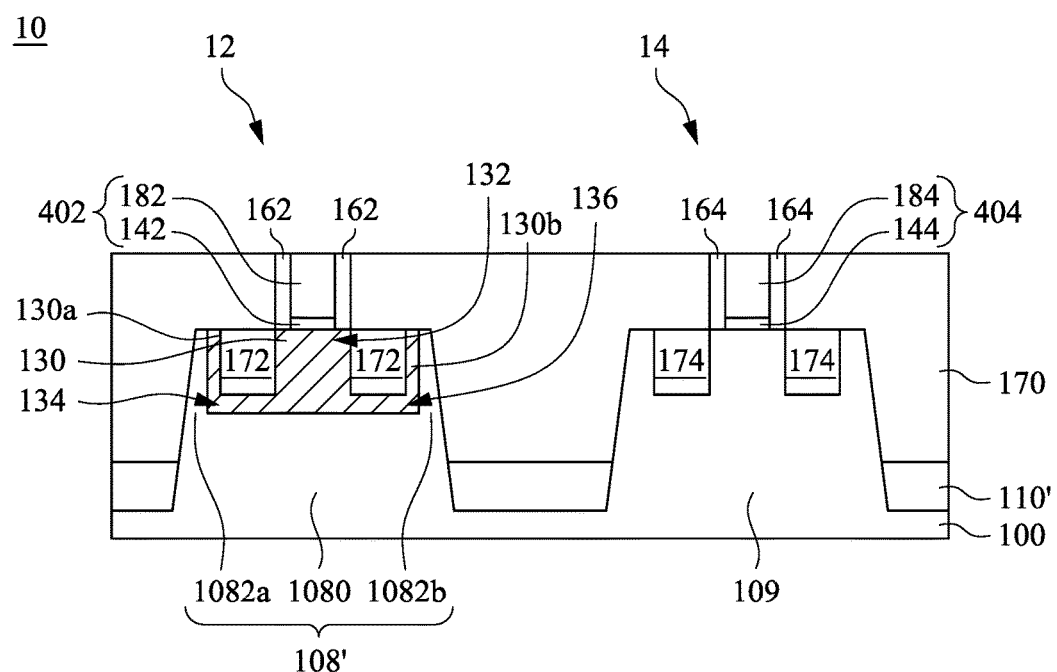

Reference is made to FIG. 18. FIG. 18 is a cross-sectional view of the local semiconductor device 10. After the removing of the dummy gate electrodes 152 and 154, metal gate electrodes 182 and 184 are respectively formed in the openings 156 and 158 (see FIG. 17). The gate electrodes 182 and 184 are formed by the deposition of aluminum or other conductive metal such as copper, tungsten, or titanium. In some embodiments, depositing one of the openings 162 and 164 includes depositing a work function layer prior to depositing a metal fill layer. The gate dielectric 142 and the gate electrode 182 can refer to as a gate structure 402, and the gate dielectric 144 and the gate electrode 184 can refer to as a gate structure 404.

As shown in FIG. 18, a first device 12 and a second device 14 are formed. The first device 12 includes the top semiconductor fin 130, the first sidewall structure 1082a and the second sidewall structure 1082b, the epitaxy structures 172, the gate structure 402 (or the gate structure 302 of FIG. 16), and the gate spacers 162. The second device 14 includes the semiconductor fin 109, the epitaxy structures 174, the gate structure 404 (or the gate structure 304 of FIG. 16), and the gate spacers 164. In the embodiments where the first device 12 is p-channel metal-oxide-semiconductor field-effect transistors (p-channel MOSFETs), and the second device 14 is n-channel MOSFETs.

Figure 19:
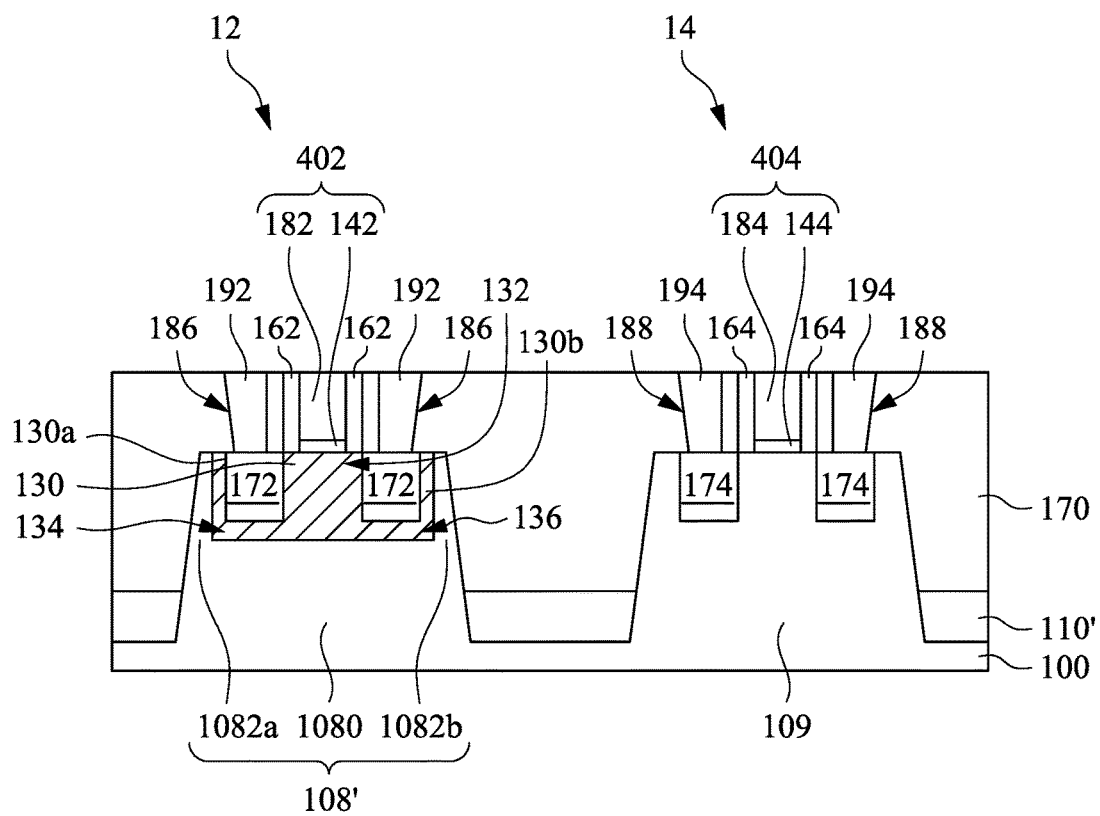

Reference is made to FIG. 19. FIG. 19 is a cross-sectional view of the local semiconductor device 10. After the forming of the metal gate electrodes 182 and 184, trenches 186 and 188 are formed in the ILD 170. The trenches 186 expose the epitaxy structures 172, and the trenches 188 expose the epitaxy structures 174. Metal such as tungsten is then deposited into the trenches 186 and 188 down to the epitaxy structures 172 and 174 to form source and drain contacts 192 and 194. When formed, the source and drain contacts 192 and 194 are conductively coupled to the epitaxy structures 172 and 174.

According to some embodiments, the top semiconductor fin is in contact with the first sidewall structure, the second sidewall structure, and the bottom semiconductor fin, whereby enabling the channel portion of the top semiconductor fin to improve fully strain channel (FSC) due to the two opposite ends of the top semiconductor fin strain with the first sidewall structure and the second sidewall structure of the etched semiconductor fin respectively, thus to improve performance of said two opposite ends. As such, a stress relaxation occurring at the two opposite ends of the top semiconductor fin reduces epitaxial defects, such as, voids or dislocations, at an interface of the sidewall structure and the top semiconductor fin. Further, the epitaxial defects of the two opposite ends of the top semiconductor fin will be reduced. Hence, the epitaxial quality of the channel portion of top semiconductor fin will also be enhanced, such that the performance of the channel portion will be improved.

According to some embodiments, a semiconductor device includes a substrate, a bottom semiconductor fin, at least one sidewall structure, a top semiconductor fin, and a gate structure. The bottom semiconductor fin is disposed on the substrate. The sidewall structure protrudes from the semiconductor fin. The top semiconductor fin is disposed on the bottom semiconductor fin. The top semiconductor fin includes a channel portion and at least one source/drain portion. The source/drain portion is disposed between the channel portion and the sidewall structure. The gate structure covers the channel portion of the top semiconductor fin.

According to some embodiments, a semiconductor device includes a substrate, a bottom semiconductor fin, atop semiconductor fin, a first sidewall structure and a second sidewall structure, and a gate structure. The bottom semiconductor fin is disposed on the substrate and extending along a direction. The top semiconductor fin is disposed on the bottom semiconductor fin. The first sidewall structure and a second sidewall structure are disposed on two opposite ends of the top semiconductor fin and arranged in the direction, in which the top semiconductor fin is made of a material that is different from that of the first sidewall structure and the second sidewall structure. The gate structure is disposed between the first sidewall structure and the second sidewall structure and straddles across the top semiconductor fin.

According to some embodiments, a method for manufacturing a semiconductor device includes forming fin structure on a substrate; forming an isolation material surrounding the fin structure; removing a portion of the fin structure to form a bottom semiconductor fin and sidewall structures over the bottom semiconductor fin, in which the sidewall structures are in contact with the isolation material, and the bottom semiconductor fin and the sidewall structures define a trench therebetween; forming a top semiconductor fin in the trench, between the sidewall structures, and over the semiconductor fin; and forming a gate structure on the top semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a bottom semiconductor fin disposed on the substrate;
   first and second sidewall structures protruding from the bottom semiconductor fin;
   a top semiconductor fin disposed on the bottom semiconductor fin, wherein the top semiconductor fin and the bottom semiconductor fin are made of different semiconductive materials, the top semiconductor fin is sandwiched between the first and second sidewall structures, and the top semiconductor fin comprises:
      a channel portion; and
      source and drain portions, wherein the source portion is between the channel portion and the first sidewall structure, and the drain portion is between the channel portion and the second sidewall structure; and
   a gate structure over the channel portion of the top semiconductor fin.

2. The semiconductor device of claim 1, wherein the top semiconductor fin is in contact with the first and second sidewall structures and the bottom semiconductor fin.

3. The semiconductor device of claim 1, wherein the first and second sidewall structures are located on opposite ends of the top semiconductor fin.

4. The semiconductor device of claim 1, further comprising first and second epitaxy structures respectively partially embedded in the source and drain portions of the top semiconductor fin, wherein the first epitaxy structure is between the first sidewall structure and the channel portion.

5. The semiconductor device of claim 1, further comprising an interlayer dielectric (ILD) layer disposed over the substrate, wherein the first sidewall structure is located between the ILD layer and the top semiconductor fin.

6. The semiconductor device of claim 1, further comprising an isolation structure disposed around the bottom semiconductor fin, wherein a bottom surface of the top semiconductor fin is higher than a top surface of the isolation structure.

7. The semiconductor device of claim 1, wherein the first and second sidewall structures and the bottom semiconductor fin are made of the same semiconductive material.

8. The semiconductor device of claim 4, wherein the first sidewall structure is separated from the first epitaxy structure.

9. The semiconductor device of claim 4, wherein a bottom portion of the first sidewall structure is lower than a bottom surface of the first epitaxy structure.

10. The semiconductor device of claim 8, wherein a portion of the top semiconductor fin is disposed between and in contact with the first sidewall structure and the first epitaxy structure.

11. The semiconductor device of claim 7, wherein a lattice constant of the top semiconductor fin is greater than that of the first and second sidewall structures and the bottom semiconductor fin.

12. A semiconductor device, comprising:
    a substrate;
    a bottom semiconductor fin disposed on the substrate;
    a top semiconductor fin disposed on the bottom semiconductor fin;
    a first sidewall structure and a second sidewall structure disposed on opposite ends of the top semiconductor fin, wherein the top semiconductor fin is made of a material that is different from that of the first sidewall structure and the second sidewall structure, and a top surface of the top semiconductor fin is substantially coplanar with top surfaces of the first and second sidewall structures; and
    a gate structure straddling across the top semiconductor fin.

13. The semiconductor device of claim 12, wherein the first sidewall structure and the second sidewall structure protrude from the bottom semiconductor fin.

14. The semiconductor device of claim 12, wherein the top semiconductor fin is in contact with the bottom semiconductor fin, the first sidewall structure and the second sidewall structure.

15. The semiconductor device of claim 12, wherein the top semiconductor fin comprises a channel region located between the first sidewall structure and the second sidewall structure and below the gate structure.

16. A method for manufacturing a semiconductor device comprising:
    forming a fin structure on a substrate;
    forming an isolation material surrounding the fin structure;
    removing a portion of the fin structure to form a bottom semiconductor fin and sidewall structures over the bottom semiconductor fin, wherein the sidewall structures are in contact with the isolation material, and the bottom semiconductor fin and the sidewall structures define a trench therebetween;
    forming a top semiconductor fin in the trench, wherein the top semiconductor fin is between the sidewall structures and over the bottom semiconductor fin, the fin structure is made of a semiconductive material, and the top semiconductor fin is made of an epitaxy material that is different from the semiconductive material; and
    forming a gate structure on the top semiconductor fin.

17. The method of claim 16, further comprising:
    forming a patterned mask layer over the isolation material and the fin structure, wherein the portion of the fin structure is removed through the patterned mask layer, and the sidewall structures are covered by the patterned mask layer.

18. The method of claim 16, wherein forming the top semiconductor fin in the trench comprises:
    epitaxially growing the epitaxy material at least in the trench and over the bottom semiconductor fin; and
    removing the epitaxy material above a top surface of the isolation material to form the top semiconductor fin in the trench and over the bottom semiconductor fin.

19. The method of claim 16, wherein forming the top semiconductor fin is performed such that the top semiconductor fin is in contact with the isolation material.

20. The method of claim 18, wherein epitaxially growing the epitaxy material at least in the trench comprises epitaxially growing the epitaxy material at least from the sidewall structures.

* * * * *